United States Patent
Strock et al.

(10) Patent No.: US 10,273,583 B2
(45) Date of Patent: Apr. 30, 2019

(54) GAS TURBINE ENGINE COMPONENT COATING WITH SELF-HEALING BARRIER LAYER

(71) Applicant: United Technologies Corporation, Farmington, CT (US)

(72) Inventors: Christopher W. Strock, Kennebunk, ME (US); Shahram Amini, Glastonbury, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 239 days.

(21) Appl. No.: 15/036,885

(22) PCT Filed: Nov. 5, 2014

(86) PCT No.: PCT/US2014/064023
§ 371 (c)(1),
(2) Date: May 16, 2016

(87) PCT Pub. No.: WO2015/080839
PCT Pub. Date: Jun. 4, 2015

(65) Prior Publication Data
US 2016/0289844 A1    Oct. 6, 2016

Related U.S. Application Data

(60) Provisional application No. 61/909,074, filed on Nov. 26, 2013.

(51) Int. Cl.
| C23C 28/04 | (2006.01) |
| C23C 4/06 | (2016.01) |
| F01D 25/00 | (2006.01) |
| F02C 7/24 | (2006.01) |
| F01D 5/28 | (2006.01) |

(Continued)

(52) U.S. Cl.
CPC .......... *C23C 28/042* (2013.01); *C04B 41/009* (2013.01); *C04B 41/5061* (2013.01); *C04B 41/5068* (2013.01); *C04B 41/87* (2013.01); *C23C 4/06* (2013.01); *C23C 4/10* (2013.01); *F01D 5/288* (2013.01); *F01D 25/00* (2013.01); *F02C 7/24* (2013.01);

(Continued)

(58) Field of Classification Search
USPC .................... 428/325, 469, 697, 698, 699
See application file for complete search history.

(56) References Cited

U.S. PATENT DOCUMENTS

| 5,763,107 A | 6/1998 | Rickerby et al. |
| 5,981,078 A | 11/1999 | Tabersky et al. |

(Continued)

FOREIGN PATENT DOCUMENTS

WO    WO 2012000742 A1 * 1/2012 ......... C23C 14/0635

OTHER PUBLICATIONS

Gupta et. al. Wear, 2007, 1-9.*

(Continued)

*Primary Examiner* — Archene A Turner
(74) *Attorney, Agent, or Firm* — Carlson, Gaskey & Olds, P.C.

(57) ABSTRACT

A component for high temperature applications includes a substrate and a layer of an aluminum-containing MAX phase material and another material applied to the substrate.

10 Claims, 1 Drawing Sheet

(51) Int. Cl.
*C23C 4/10* (2016.01)
*C04B 41/87* (2006.01)
*C04B 41/00* (2006.01)
*C04B 41/50* (2006.01)

(52) U.S. Cl.
CPC ............... *F05D 2300/182* (2013.01); *F05D 2300/2261* (2013.01); *F05D 2300/2283* (2013.01)

(56) References Cited

U.S. PATENT DOCUMENTS

| | | | |
|---|---|---|---|
| 6,887,594 B2 | 5/2005 | Li et al. | |
| 8,084,086 B2 | 12/2011 | Hass et al. | |
| 2005/0147840 A1 | 7/2005 | Spitsberg | |
| 2005/0262965 A1 | 12/2005 | Palanisamy et al. | |
| 2006/0194688 A1* | 8/2006 | Sundberg | C04B 35/5607 501/87 |
| 2008/0081172 A1* | 4/2008 | Strock | C23C 4/02 428/304.4 |
| 2008/0131686 A1* | 6/2008 | Strock | C23C 4/02 428/332 |
| 2009/0047510 A1* | 2/2009 | Schuisky | C23C 14/0688 428/337 |
| 2010/0047614 A1 | 2/2010 | Brinley | |
| 2010/0055492 A1* | 3/2010 | Barsoum | B22D 19/02 428/613 |
| 2010/0090879 A1* | 4/2010 | Janis | H01Q 17/00 342/1 |
| 2010/0247953 A1 | 9/2010 | Bossmann et al. | |
| 2010/0255289 A1 | 10/2010 | Lewinsohn et al. | |
| 2012/0012403 A1 | 1/2012 | de Roshemont | |
| 2012/0164430 A1* | 6/2012 | Thebault | C04B 35/6286 428/293.4 |

OTHER PUBLICATIONS

Brady et. al. Materials and Corrosion, 2005, 56, 11, 748-755.*
International Preliminary Report on Patentability for PCT Application No. PCT/US2014/064023, dated Jun. 9, 2016.
Spencer, C.B., et al. "The Reactivity of Ti2A1C and Ti3SiC2 with SiC Fibers and Powders up to Temperatures of 1550 C", Journal of American Ceramic Society, vol. 94, No. 6 Jun. 2, 2011, pp. 1734-1743, XP055174818.
Li, J.J., et al. "Short-term oxidation resistance and degradation of CrAlC coating on M38G superalloy at 9001100C," Corrosion Science, Oxford, GB, bol. 53, o 11, Jul. 16, 2011, pp. 3813-3820.
Supplementary European Search Report for European Application No. 14865602.8 dated Mar. 27, 2017.
Journal Articel Oxidaton and Crack Healing Behavior of a Fine-Grained CR2AlC Ceramic. Shibo Li J. Am Ceram. Soc 96 [3] 892-899 (2013).
International Search Report and Written Opinion for PCT Application No. PCT/US.2014/064023, dated Feb. 9, 2015.

* cited by examiner

GAS TURBINE ENGINE COMPONENT COATING WITH SELF-HEALING BARRIER LAYER

CROSS-REFERENCE TO RELATED APPLICATIONS

This application claims priority to U.S. Provisional Application No. 61/909,074, which was filed on Nov. 26, 2013 and is incorporated herein by reference.

BACKGROUND

This disclosure relates to a coating for components in applications such as gas turbine engines and internal combustion engines.

Many gas turbine engine components are subject to temperatures in excess of the melting temperature of the component substrate, which may be constructed from a nickel superalloy or non-oxide ceramic, for example. Cooling features and thermal barrier or environmental coatings are used to protect the substrate from these extreme temperatures.

Thermal barrier coatings (TBC) or environmental barrier coating (EBC) made from yttria-stabilized zirconia (YSZ) and gadolinium zirconium oxide are typically used to reduce the temperature of cooled turbine and combustor components. Additionally, these materials may also be used as abradable seal materials on cooled turbine blade outer air seals (BOAS) as well as other components. In these applications, there are several degradation and failure modes. During engine operation, thermal barrier coatings may become spalled, delaminated, chipped or eroded, for example, due to debris or environmental degradation.

Bond coats for thermal barrier coatings as well as environmental barrier coatings for high temperature composite materials rely on an oxygen diffusion barrier layer that is often alpha alumina. Alpha alumina is an excellent barrier to oxygen diffusion and naturally forms at elevated temperature on aluminum rich alloys. This layer is often referred to as a thermally grown oxide (TGO). As this TGO layer grows with time and temperature it typically buckles and spalls off at which time it must regenerate, drawing further from the aluminum reserves of the host material by diffusion. As the aluminum gets depleted, non-ideal oxides begin to form which make the TGO less effective at preventing further oxidation. Making TGO adhesion more difficult is the coefficient of thermal expansion (CTE) mismatch between the metallic aluminum donor and alumina layers during the thermal cycling present in most applications.

SUMMARY

In one exemplary embodiment, a component for high temperature applications includes a substrate and a layer of an aluminum-containing MAX phase material and another material applied to the substrate.

In a further embodiment of the above, the layer provides a MAX phase/metal matrix composite.

In a further embodiment of any of the above, the substrate is at least one of a nickel based alloy, an iron-nickel based alloy, a cobalt based alloy, a molybdenum based alloy, or a niobium based alloy.

In a further embodiment of any of the above, a thermal barrier coating is applied to the layer.

In a further embodiment of any of the above, the layer is a bond coat, and the other material is at least one of a MCrAlY material (where M is nickel, iron and/or cobalt), an aluminide material, a platinum aluminide material, or a ceramic-based material.

In a further embodiment of any of the above, the aluminum-containing MAX phase material has an aluminum ratio of 0.6-1.4 times a stoichiometric aluminum value of the MAX phase material.

In a further embodiment of any of the above, the substrate is a non-oxide ceramic including at least one of a ceramic based substrate or a ceramic matrix composite substrate.

In a further embodiment of any of the above, the non-oxide ceramic is SiC or SiN.

In a further embodiment of any of the above, the layer is an environment barrier coating and the other material is at least one of an alumina-containing ceramic, mullite, zircon, or rare earth silicates.

In a further embodiment of any of the above, the aluminum-containing MAX phase material has an aluminum ratio of 0.6-1.4 times a stoichiometric aluminum value of the MAX phase material.

In another exemplary embodiment, a method of providing a self-healing coating includes. A layer of an aluminum-containing MAX phase material and another material are applied to a substrate. The method includes exposing the layer to a temperature greater than 2000° F. to form alpha aluminum.

In a further embodiment of any of the above, the layer provides a MAX phase/metal matrix composite.

In a further embodiment of any of the above, the substrate is at least one of a nickel based alloy, an iron-nickel based alloy, a cobalt based alloy, a molybdenum based alloy, or a niobium based alloy.

In a further embodiment of any of the above, sing a thermal bather coating is applied to the layer.

In a further embodiment of any of the above, the layer is a bond coat. The other material is at least one of a MCrAlY material (where M is nickel, iron and/or cobalt), an aluminide material, a platinum aluminide material, or a ceramic-based material.

In a further embodiment of any of the above, the aluminum-containing MAX phase material has an aluminum ratio of 0.6-1.4 times a stoichiometric aluminum value of the MAX phase material.

In a further embodiment of any of the above, the substrate is a non-oxide ceramic including at least one of a ceramic based substrate or a ceramic matrix composite substrate.

In a further embodiment of any of the above, the non-oxide ceramic is SiC or SiN.

In a further embodiment of any of the above, the layer is an environmental barrier coating, and the other material is at least one of an alumina-containing ceramic, mullite, zircon, or rare earth silicates.

In a further embodiment of any of the above, the aluminum-containing MAX phase material has an aluminum ratio of 0.6-1.4 times a stoichiometric aluminum value of the MAX phase material.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
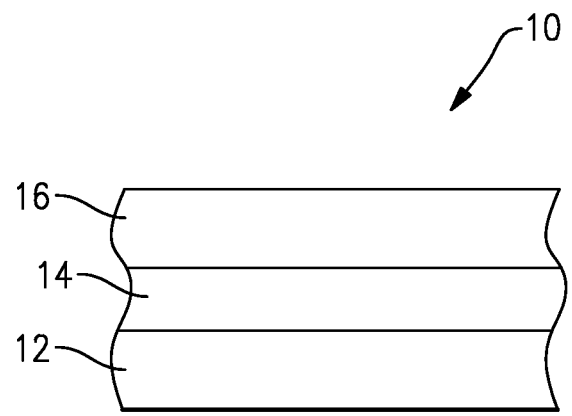
FIG. 1 is a highly schematic view of a component with a self-healing bond coat supporting a thermal barrier coating.

A component 10 is schematically shown in FIG. 1. The component 10, which may be a turbine blade airfoil, for example. The component 10 may be used in a variety of gas turbine engine components applications, including but not limited to vanes, blades, blade outer air seals, fuel nozzle guides, combustor liners, exhaust liners, and augmenter liners. The component 10 may be used in a variety of internal combustion engine component applications, such as exhaust manifolds, intake manifolds, valves, headers, turbo chargers, external waste gates, exhaust down pipes, exhaust systems, converters and mufflers.

The component 10 includes a substrate 12 that is formed from a material, such as a nickel based alloy, an iron-nickel based alloy, a cobalt based alloy, a molybdenum based alloy, or a niobium based alloy. A bond coat 14 is applied to the substrate 12, and a thermal barrier coating 16 is applied to the bond coat 14. The thermal barrier coating 16 has an exterior surface on a hot side of the component. In the example illustrated, the thermal barrier coating 16 is the outermost layer of the component 10 on a hot side of the component. Additional layers may be provided on the thermal barrier coating 16 covering the exterior surface, if desired.

The bond coat may be applied using any suitable technique known in the art. The bond coat 14 may be applied by low pressure plasma spray (LPPS), atmospheric plasma spray (APS), high velocity oxygen fuel (HVOF), high velocity air fuel (HVAF), physical vapor deposition (PVD), chemical vapor deposition (CVD) or cathodic arc, for example. Once the substrate surface is coated, the thermal barrier coating may be applied, for example, by using an electron beam physical vapor deposition (EBPVD) process, a suspension plasma spray (SPS), sputtering, sol gel, slurry, low pressure plasma spray (LPPS) or air plasma spray (APS), for example.

The thermal barrier coating 14 may comprise one or more layers of a ceramic material such as an yttria stabilized zirconia material, a gadolinia stabilized zirconia material, cubic/fluorite/pyrochlore/delta phase fully stabilized zirconates where stabilizers are any oxide or mix of oxides including Lanthanide series, Y, Sc, Mg, Ca, or further modified with Ta, Nb, Ti, Hf. The thermal barrier coating may also be hafnia based. The yttria stabilized zirconia material may contain from 3.0 to 40 wt. % yttria and the balance zirconia. The gadolinia stabilized zirconia material may contain from 5.0 to 99.9 wt. % gadolinia, and in one example, 30 to 70 wt. % gadolinia and the balance zirconia.

The bond coat 14 may be either a MCrAlY material (where M is nickel, iron and/or cobalt), an aluminide material, a platinum aluminide material, or a ceramic-based material. NiCoCrAlY bond coat and an yttria-stabilized zirconia (YSZ) thermal barrier coating may be used to provide the disclosed bond coat 14 and thermal barrier coating 16, for example. Of course, numerous other ceramic layers may be used. MCrAlY coatings also include MCrAlYX coatings, where X is at least one of a reactive element (Hf, Zr, Ce, La, Si) and/or refractory element (Ta, Re, W, Nb, Mo).

In addition to the above bond coat materials, the bond coat 14 includes a MAX phase material, which forms a MAX phase/metal matrix composite. A MAX phase material is a group of ternary carbides with the formula $M_{n+1}AX_n$ (where n=1-3, M is an early transition metal, A is an A-group element and X is carbon and/or nitrogen). Desired MAX phase materials for the bond coat 14 include aluminum as the A-group element, which provides an aluminum rich source for thermally grown oxides having a high aluminum diffusion rate. Example MAX phase materials include $Cr_2AlC$, $Ti_2AlC$, Ti2AlN and $Ti_3AlC_2$. Niobium-, tantalum- and vanadium-based MAX phase materials may also be used.

Aluminum-containing MAX phase materials having an extremely high diffusion rate of aluminum along the basal plane direction as well as provide phase stability of materials to as little as 0.6 of the stoichiometric aluminum ratio. One example desired amount of aluminum ratio in the MAX phase material is 0.6-1.4 the stoichiometric value, which provides high aluminum mobility. As a result, a bond coat 14 is provided that forms a high purity alumina TGO with rapid self-healing properties in temperatures above 2000° F. (1093° C.).

Example MAXMET (max phase/metal matrix composite) layer manufacturing methods include co-spraying of individual constituent MAX phase and metal matrix composite particles. The MAXMET particle size is, for example, 0.02 to 200 microns (0.00079 to 7.90 mils) MAX phase particles having a size of 1-3 microns (0.039 to 0.12 mils) are available as MAXTHAL powder from Sandvik Materials Technology. One method of producing the metal matrix composite particles is ball milling the constituents to mechanically alloy. This would produce a desirable distribution and size of 0.02 to 0.5 microns (0.0079 to 0.020 mils) The finer MAX phase particles result in a more homogeneous composite and provide optimal TGO growth uniformity.

The MAXMET material may be applied to the component by spraying the MAXMET particles by agglomeration, sintering, crushing of MAXMET, or atomization of a MAX particle suspension in a molten matrix (slush). Alternatively, a MAXMET preform may be manufactured and then bonded to the part by diffusion bonding or brazing. MAXMET may also be applied by directly forming the layer on the surface by hot pressing constituent powders or MAXMET particles.

Figure 2:
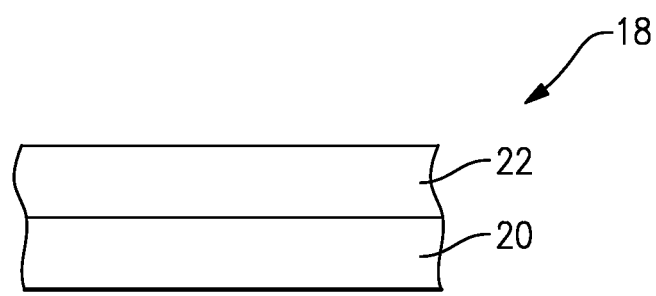
FIG. 2 is a highly schematic view of a component with a self-healing environmental bather coating supported on a substrate.

Another component 18 is shown in FIG. 2. The substrate 20 is a non-oxide ceramic, such as a SiC or SiN ceramic based substrate or a ceramic matrix composite substrate. An environmental barrier coating 22 is applied to the substrate 20. The environmental barrier coating 22 may include an alumina containing ceramic, e.g., mullite, zircon ($ZrSiO_4$), rare earth silicates, combinations of at least one of the foregoing, and the like. Suitable rare earth silicates include, but are not limited to, yttrium silicate, yttrium disilicate, magnesium aluminate spinel, and the like.

The environment bather coating 22 includes a MAX phase material as described above with respect to the bond coat 14.

The disclosed coating provides a higher purity and more stable alumina TGO layer than prior art oxidation resistant materials due to its improved ability to diffuse aluminum to the surface compared to prior art bond coat and aluminide materials. The MAX phase/metal matrix composite is highly damage tolerant, has reduced CTE mismatch with the TGO, larger aluminum reservoir and higher aluminum diffusion rates compared the prior art coatings.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A component for high temperature applications, comprising:
   a substrate; and
   a layer of an aluminum-containing MAX phase material and another material applied to the substrate; wherein
   the layer provides a MAX phase/ metal matrix composite including a first MAX phase material;
   the first MAX phase material has a particle size of between 1-3 microns; and
   the metal matrix is formed from particles having a particle size of 0.02 to 0.5 microns.

2. The component according to claim 1, wherein the substrate is at least one of a nickel based alloy, an iron-nickel based alloy, a cobalt based alloy, a molybdenum based alloy, or a niobium based alloy.

3. The component according to claim 1, comprising a thermal barrier coating applied to the layer.

4. The component according to claim 3, wherein the thermal barrier coating includes at least one of an yttria stabilized zirconia material and a gadolinia stabilized zirconia material.

5. The component according to claim 3, wherein the layer is a bond coat, and the other material is at least one of a MCrAlY material (where M is nickel, iron and/or cobalt), an aluminide material, a platinum aluminide material, or a ceramic-based material.

6. The component according to claim 3, wherein the aluminum-containing MAX phase material has an aluminum ratio of 0.6-1.4 times a stoichiometric aluminum value of the first MAX phase material.

7. The component according to claim 1, wherein the substrate is a non-oxide ceramic including at least one of a ceramic based substrate or a ceramic matrix composite substrate.

8. The component according to claim 7, wherein the non-oxide ceramic is SiC or SiN.

9. The component according to claim 7, wherein the layer is an environment barrier coating, and the other material is at least one of an alumina-containing ceramic, mullite, zircon, or rare earth silicates.

10. The component according to claim 9, wherein the aluminum-containing MAX phase material has an aluminum ratio of 0.6-1.4 times a stoichiometric aluminum value of the first MAX phase material.

\* \* \* \* \*